(12) United States Patent
Yu et al.

(10) Patent No.: US 11,764,235 B2
(45) Date of Patent: Sep. 19, 2023

(54) TANDEM SOLAR CELL MODULE

(71) Applicant: KOREA INSTITUTE OF SCIENCE AND TECHNOLOGY, Seoul (KR)

(72) Inventors: Hyeong Geun Yu, Seoul (KR); Jeung Hyun Jeong, Seoul (KR); Gee Yeong Kim, Seoul (KR); Yoon Hee Jang, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 177 days.

(21) Appl. No.: 17/191,092

(22) Filed: Mar. 3, 2021

(65) Prior Publication Data
US 2022/0173137 A1 Jun. 2, 2022

(30) Foreign Application Priority Data

Nov. 27, 2020 (KR) .................. 10-2020-0162616

(51) Int. Cl.
H01L 27/142 (2014.01)
H01L 31/05 (2014.01)
H01L 31/054 (2014.01)
H01L 31/0224 (2006.01)

(52) U.S. Cl.
CPC .... H01L 27/142 (2013.01); H01L 31/022466 (2013.01); H01L 31/0504 (2013.01); H01L 31/0547 (2014.12)

(58) Field of Classification Search
CPC ......... H01L 27/1421; H01L 31/022466; H01L 31/0443; H01L 31/046; H01L 31/0465; H01L 31/0504; H01L 31/0547
See application file for complete search history.

(56) References Cited

U.S. PATENT DOCUMENTS

| | | | | |
|---|---|---|---|---|
| 2008/0264478 A1* | 10/2008 | Ahn | ...... | H01L 31/0392 136/255 |
| 2010/0282291 A1* | 11/2010 | Goto | ...... | H01L 31/022425 257/E31.113 |
| 2012/0103387 A1* | 5/2012 | Fischer | ...... | H10K 39/601 257/E51.012 |

FOREIGN PATENT DOCUMENTS

KR 101431817 B1 8/2014
KR 1020190016927 A 2/2019

* cited by examiner

*Primary Examiner* — Mayla Gonzalez Ramos
(74) *Attorney, Agent, or Firm* — Rabin & Berdo, P.C.

(57) ABSTRACT

The present invention relates to a colored tandem solar cell module, and more particularly, a high-efficiency thin-film colored tandem solar cell module which does not require separate photocurrent matching, implements a color without a separate color filter, and generates power with high efficiency. According to the present invention, it is possible to provide a colored tandem solar cell module including solar cells, which each include a bottom electrode having an inverse diode structure formed by sequentially stacking a first electrode, a first semiconductor layer, a second semiconductor layer, and a second electrode on a substrate, a light absorption layer formed on the bottom electrode, and a top electrode formed on the light absorption layer, thereby eliminating the need for photocurrent matching, implementing a color without a separate color filter, and improving efficiency.

13 Claims, 8 Drawing Sheets

TANDEM SOLAR CELL MODULE

CROSS-REFERENCE TO RELATED APPLICATION

This application claims priority to and the benefit of Korean Patent Application No. 2020-0162616, filed on Nov. 27, 2020, the disclosure of which is incorporated herein by reference in its entirety.

BACKGROUND

1. Field of the Invention

The present invention relates to a tandem solar cell module, and more particularly, a high-efficiency thin-film colored tandem solar cell module which does not require separate photocurrent matching, may implement colors without a separate color filter, and may generate power with high efficiency.

2. Discussion of Related Art

In general, solar cells are semiconductor elements that directly convert solar energy into electrical energy and basically have a junction form of a p-type semiconductor and an n-type semiconductor similar to a diode. Silicon-based solar cells are mainly used as such solar cells.

Silicon-based solar cells use silicon for a semiconductor substrate. Silicon corresponds to an indirect interband transition semiconductor and has a disadvantage in that only light having energy greater than or equal to band gap energy of silicon can generate electron-hole pairs. In addition, since the silicon-based solar cell has a disadvantage in that since about 30% or more of light incident into the solar cell is reflected on a surface of a silicon wafer, the solar cell has low efficiency.

Compared to such a silicon-based solar cell, a solar cell using a III-V semiconductor has various band gap characteristics. By using the characteristics, compound cells absorbing light with different wavelengths have been constructed, and a tandem structure in which the cells have been coupled through a tunnel junction has been used to implement photovoltaic efficiency higher than that of a silicon-based solar cell.

Solar cell or multi junction solar cell technology having a tandem structure is technology for improving photovoltaic efficiency by connecting a plurality of cells with different light absorption spectra in series. The conventional multi junction solar cell technology is implemented using high-cost III-V semiconductors with very high efficiency and is widely used for an ultra-high efficiency energy source such as an energy source for space.

In recent years, as research is actively conducted on tandem solar cells using low-cost and high-efficiency thin-film solar cell technology, there is also a growing need for single integrated modulation technology for tandem solar cells. However, a need for matching in double-junction tandem solar cells remains a great task. For example, in a double-junction tandem solar cell, in the case of a series connection structure, photocurrent matching between a top cell and a bottom cell is required, and in the case of a parallel connection structure, photovoltage matching between a top cell and a bottom cell is required.

FIG. 1 is a diagram illustrating a thin-film tandem solar cell module having a series connection structure according to the related art, and FIG. 2 is an equivalent circuit diagram of the thin-film tandem solar cell module shown in FIG. 1.

Referring to FIGS. 1 and 2, bottom cells "Cell 1" and top cells "Cell 2" are connected in series to constitute tandem solar cells, and then, the adjacent tandem solar cells are connected in series again to constitute the thin-film tandem solar cell module having a series connection structure according to the related art.

When photocurrent densities and photovoltages generated in the bottom cell "Cell 1" and the top cell "Cell 2" are denoted by $J_1$ (Cell 1), $J_2$ (Cell 2), $V_1$ (Cell 1), and $V_2$ (Cell 2), in order to optimize the photovoltaic efficiency of the tandem solar cell module, a photocurrent density should satisfy a condition of "$J=J_1=J_2$." In this case, in the series connection structure as shown in FIG. 1, a photovoltage becomes "$V=V_1+V_2$." For photocurrent matching between "Cell 1" and "Cell 2," a band gap and a light absorption amount of each cell should be adjusted.

For example, when light is incident through a top electrode of "Cell 2," a thickness of a material of a light absorption layer in "Cell 2" should be adjusted to adjust an amount of light transmitted to "Cell 1," or a band gap of "Cell 2" should be adjusted to adjust a light spectrum transmitted to "Cell 1."

Due to such a limit condition, in the thin-film tandem solar cell module having a series connection structure according to the related art, for the photocurrent matching, there are difficulties in that the thickness of the material of the light absorption layer and the band gap should be precisely adjusted, and the material of the light absorption layer should be appropriately selected.

FIG. 3 is a diagram illustrating a thin-film tandem solar cell module having a parallel connection structure according to the related art, and FIG. 4 is an equivalent circuit diagram of the thin-film tandem solar cell module shown in FIG. 3.

Referring to FIGS. 3 and 4, unlike the series connection structure, bottom cells "Cell 1" and top cells "Cell 2" each constitute independent arrays (modules), and the constituted top cell array (structure in which the top cells are connected in series) and the constituted bottom cell array (structure in which the bottom cells are connected in series) are connected in parallel to constitute the thin-film tandem solar cell module having the parallel connection structure according to the related art.

In the thin-film tandem solar cell module having such a parallel connection structure, the total photocurrent density has a relationship of "$J=J_1+J_2$" as shown in FIG. 4. In this case, the relationship presupposes photovoltage matching between the top cell array including the top cells "Cell 2" and the bottom cell array including the bottom cells "Cell 1." When the upper and bottom cell arrays have different photovoltages, a reverse current $J_L$ occurs in a direction from an array with a high photovoltage to an array with a low photovoltage. This not only reduces the total photocurrent density "J," but also causes a problem in that the total photovoltage "V" is set to that of the array with a low photovoltage.

As described above, the tandem solar cell technology according to the related art has limitations in material selectivity and structural optimization for photocurrent matching or photovoltage matching due to structural characteristics thereof. That is, in the case of the photocurrent matching, since the light spectrum and intensity transmitted to the bottom cell are determined according to the thickness and band gap of the light absorption layer of the top cell, an optical distribution design is required to generate the same photocurrent in the top and bottom cells according to the material characteristics. In the case of the photovoltage matching, since a design is required to generate the same photovoltaic voltage in the top and bottom cells, there are limitations in material selection and parallel connection method. For this reason, research on thin-film tandem solar cells has still remained in a small area cell unit, and there are many difficulties in single integrated modularization.

On the other hand, thin-film solar cell technology has an advantage in that a light-transmitting colored solar cell is easy to apply to an integrated building solar cell and an integrated vehicle solar cell. However, such high value-added technologies have limitations in that the technologies should be applied without increasing power generation costs of solar cells. In particular, in the case of coloring technology, it is not technically difficult to attach a separate color filter to a solar panel, but there is a limitation in that power generation costs may be increased when the coloring technology is applied to a large area.

RELATED ART DOCUMENTS

Patent Documents (Patent Document 0001) KR 10-1431817 B1, 2014 Aug. 12
(Patent Document 0002) KR 10-2019-0016927 B1, 2019 Feb. 19

SUMMARY OF THE INVENTION

The present invention is directed to providing a tandem solar cell module that does not require photocurrent matching.

The present invention is also directed to providing a tandem solar cell module capable of implementing and controlling a color without using a separate color filter.

Technical objects of the present invention are not particularly limited to those described above, and other technical objects not described herein will also be clearly understood from the following description by a person who has a common knowledge in the technical field to which the invention pertains.

According to an aspect of the present invention, there is provided a tandem solar cell module include an array formed by connecting solar cells in series, wherein the solar cell includes a bottom electrode having an inverse diode structure in which a first electrode, a first semiconductor layer, a second semiconductor layer, and a second electrode are sequentially stacked on a substrate, a light absorption layer formed on the bottom electrode, and a top electrode formed on the light absorption layer.

According to an aspect of the present invention, there is provided a tandem solar cell module including: a substrate, a first inverse diode and a second inverse diode which are formed to be separated from each other on the substrate and each have a structure in which a first electrode, a first semiconductor layer, a second semiconductor layer, and a second electrode are sequentially stacked, a bottom cell array having a series cell array structure in which solar cells, which each include a first bottom electrode formed of the first inverse diode, a first light absorption layer formed on the first bottom electrode, and a first top electrode formed on the first light absorption layer, are connected in series, an insulating layer formed on the bottom cell array, and a top cell array connected in parallel with the bottom cell array and having a series cell array structure in which solar cells, which each include a second bottom electrode formed on the insulating layer and having at least one side portion connected to the second inverse diode, a second light absorption layer formed on the second bottom electrode, and a second top electrode formed on the second light absorption layer, are connected in series.

The first electrode and the first and second semiconductor layers may be made of a material transparent to visible light, and the second electrode may be made of an opaque material.

The first and second semiconductor layers may be semiconductor thin-film layers having opposite polarities and may be formed as one of an n-type semiconductor thin-film layer and a p-type semiconductor thin-film layer.

A reflective color may be formed on a rear surface of the substrate based on a reflection principle of a distributed Bragg reflection (DBR) due to the first and second semiconductor layers, and a color of the reflective color may be adjusted by adjusting refractive indices and thicknesses of the first and second semiconductor layers based on a condition range that satisfies [Equation 1] to [Equation 3] below.

$$R = \left[\frac{n_1(n_n)^2 - n_2(n_p)^2}{n_1(n_n)^2 + n_2(n_p)^2}\right]^2 \quad \text{[Equation 1]}$$

$$d_p = \frac{\lambda_0}{4n_p} \text{ and } d_n = \frac{\lambda_0}{4n_n} \quad \text{[Equation 2]}$$

$$\Delta\lambda = \frac{4\lambda_0}{\pi}\arcsin\left[\frac{n_n - n_p}{n_n + n_p}\right] \quad \text{[Equation 3]}$$

In [Equation 1], "R" refers to reflectance from the substrate made of glass, and in [Equation 2] and [Equation 3], "$\lambda_0$" refers to a reflected center wavelength, and "$\Delta\lambda$" refers to a spectrum width of a reflected wavelength.

A band gap of the solar cell constituting the top cell array may be greater than a band gap of the solar cell constituting the bottom cell array.

The number of the solar cells constituting the bottom cell array may be the same as or different from the number of the solar cells constituting the top cell array.

The first top electrode, the second bottom electrode, and the second top electrode may be made of a material having a transmittance of 50% or more at visible and near-infrared wavelengths.

A metal thin-film layer may be formed on the insulating layer to connect the bottom cell array and the top cell array in parallel.

The metal thin-film layer may be made of a material opaque to visible light and may be made of aluminum (Al) or molybdenum (Mo) having high adhesion with the first top electrode.

The insulating layer may be formed as an organic or inorganic thin-film layer that is transparent to visible light and near-infrared light and may be formed through an atomic layer deposition method or a chemical vapor deposition method.

A processing portion ("P1-1") and a processing portion ("P1-2"), which separate the first inverse diode from the second inverse diode, may be formed through a laser scribing method or a mechanical scribing method, and in the forming using the laser scribing method, a pulse laser having an ultraviolet wavelength absorbed by the first electrode may be used.

A processing portion ("P2-1") and a processing portion ("P2-2"), which separate the first light absorption layer of the solar cell constituting the bottom cell array, may be formed using a laser scribing method or a mechanical scribing method, and in the forming using the laser scribing method, a laser may be incident in a direction of the substrate or a direction opposite to the substrate to process and form the processing portion ("P2-1") and the processing portion ("P2-2").

A processing portion ("Pcon1") formed to connect the second bottom electrode to the second inverse diode may be formed using a laser scribing method, and in the laser scribing method, by using a laser having a wavelength, which passes through the first electrode and the first and second semiconductor layers and is absorbed by the second electrode, the first light absorption layer, the first top electrode, and the insulating layer stacked on the second electrode may be removed together with a thermal elastic force caused by the laser absorbed by the second electrode.

A processing portion ("Pcon2") formed in the insulating layer and the metal thin-film layer to connect one side of the bottom cell array and the top cell array may be formed by irradiating a laser in a direction of the substrate or a direction opposite to the substrate using a laser scribing method, and in the laser scribing method, the insulating layer is removed using a laser having a wavelength absorbed by the metal thin-film layer.

Advantageous Effects

According to the present invention, it is possible to provide a tandem solar cell module including solar cells, which each include a bottom electrode having an inverse diode structure formed by sequentially stacking a first electrode, a first semiconductor layer, a second semiconductor layer, and a second electrode, a light absorption layer formed on the bottom electrode, and a top electrode formed on the light absorption layer, thereby eliminating the need for photocurrent matching, implementing a color without a separate color filter, and generating power with high efficiency.

DETAILED DESCRIPTION OF EXEMPLARY EMBODIMENTS

Figure 1:
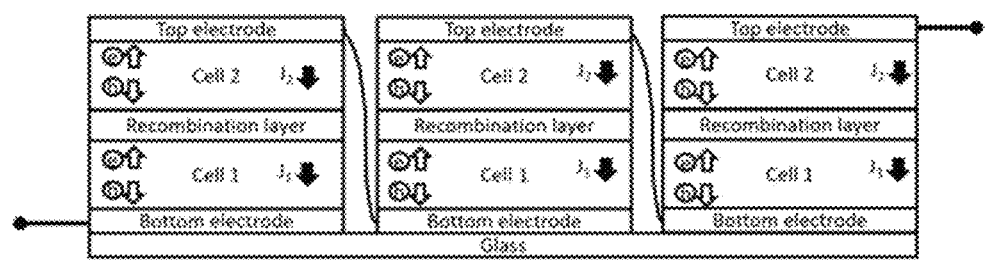
FIG. 1 is a diagram illustrating a thin-film tandem solar cell module having a series connection structure according to the related art.
Figure 2:
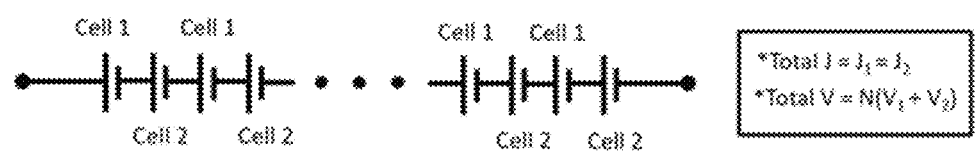
FIG. 2 is an equivalent circuit diagram of the thin-film tandem solar cell module shown in FIG. 1.

The present invention may be implemented in various different forms and is not limited to the embodiments described herein. Further, the attached drawings are provided to aid in easy understanding of the embodiments described in the present specification and not to limit the scope and spirit described in the present specification. Thus, it is to be understood that the present invention covers all modifications, equivalents, and/or alternatives falling within the scope and spirit of the present invention. Descriptions which are not necessary to understand exemplary embodiments will be omitted in order to clearly explain the exemplary embodiments in the drawings, the size, form, or shape of each component shown in the drawings may be variously modified, and like reference numerals designate like elements throughout the specification.

Terms used in the present specification are used only to describe specific embodiments and are not intended to limit the present invention. A singular form may include a plural form if there is no clearly opposite meaning in the context, and components that are distributed and implemented may be implemented in a combined form unless there is a specific limitation. In the present specification, it is to be understood that the terms such as "include" and "has" are intended to designate that a feature, number, step, operation, element, part, or a combination thereof, which is disclosed in the specification, exists, and to include that one or more other features, numbers, steps, operations, elements, parts, or combinations thereof exist or may be provided additionally.

Hereinafter, embodiments of the present invention will be described in detail with reference to the accompanying drawings.

Figure 5:
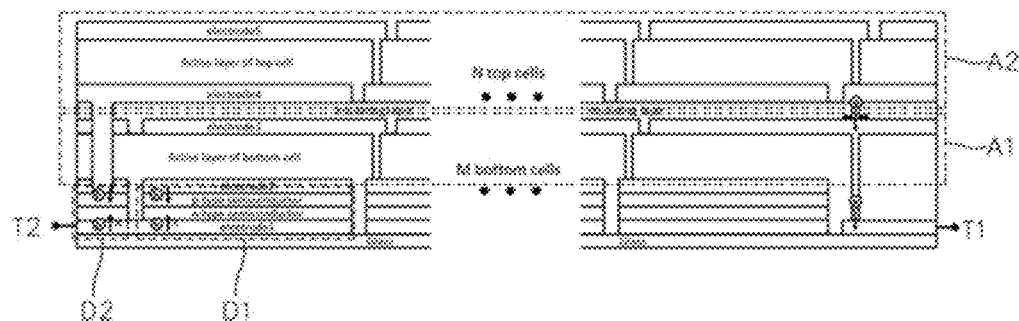
FIG. 5 is a diagram illustrating a colored tandem solar cell module according to an embodiment of the present invention.
Figure 6:
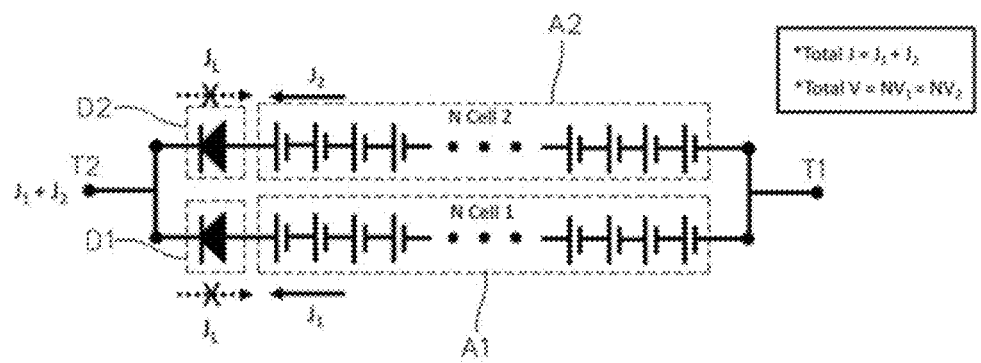
FIG. 6 is an equivalent circuit diagram of the colored tandem solar cell module shown in FIG. 5.

FIG. 5 is a diagram illustrating a colored tandem solar cell module according to an embodiment of the present invention, and FIG. 6 is an equivalent circuit diagram of the colored tandem solar cell module shown in FIG. 5. Here, an example of a colored tandem solar cell module having a two-terminal structure will be described.

Figure 3:
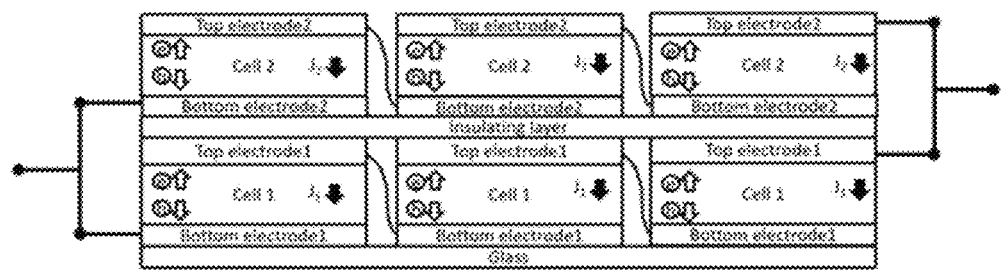
FIG. 3 is a diagram illustrating a thin-film tandem solar cell module having a parallel connection structure according to the related art.
Figure 4:
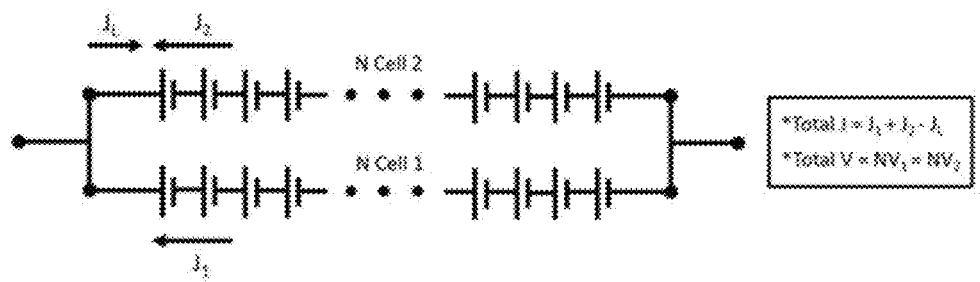
FIG. 4 is an equivalent circuit diagram of the thin-film tandem solar cell module shown in FIG. 3.

Referring to FIGS. 5 and 6, the colored tandem solar cell module according to the embodiment of the present invention has a structure similar to a parallel connection structure shown in FIGS. 3 and 4, and a plurality of solar cells "N Cell 1" and a plurality of solar cells "N Cell 2" are each independently connected in series to form a bottom cell array (module) A1 and a top cell array (module) A2, and the bottom cell array A1 and the top cell array A2 are connected in parallel between a first terminal T1 and a second terminal T2 to constitute the colored tandem solar cell module.

In order to block a reverse current due to a photovoltage difference that may occur between the bottom cell array A1 and the top cell array A2, a first inverse diode D1 for a bottom cell array is connected in series between an end of the bottom cell array A1 and the second terminal T2, and a second inverse diode D2 for a top cell array is connected in series between an end of the top cell array A2 and the second terminal T2.

The first and second inverse diodes D1 and D2 may be formed through a P-N junction or a Schottky junction, and even when a photovoltage difference occurs between the bottom cell array A1 and the top cell array A2, the first and second inverse diodes D1 and D2 may block a reverse current from flowing the second terminal T2 to the bottom cell array A1 and the top cell array A2.

Therefore, as shown in FIG. 6, in the colored tandem solar cell module according to the embodiment of the present invention, even when the tandem solar cell module is formed of a combination of light absorption layer materials exhibiting any photovoltage and photocurrent characteristics, the total current density may have a relationship of "$J=J_1+J_2$."

Meanwhile, in the colored tandem solar cell module according to the embodiment of the present invention, rectification directions of the first and second inverse diodes D1 and D2 may be changed according to the direction of a photocurrent. That is, the directions of the first and second inverse diodes D1 and D2 are designed such that a rectification is performed only in a direction in which the photocurrent flows.

Hereinafter, processes of a method of manufacturing a colored tandem solar cell module according to an embodiment of the present invention will be described in sequence with reference to FIGS. 7 to 13. Here, for convenience of description, only a portion of the colored tandem solar cell module having a two-terminal structure of FIG. 5 is illustrated.

Figure 7:
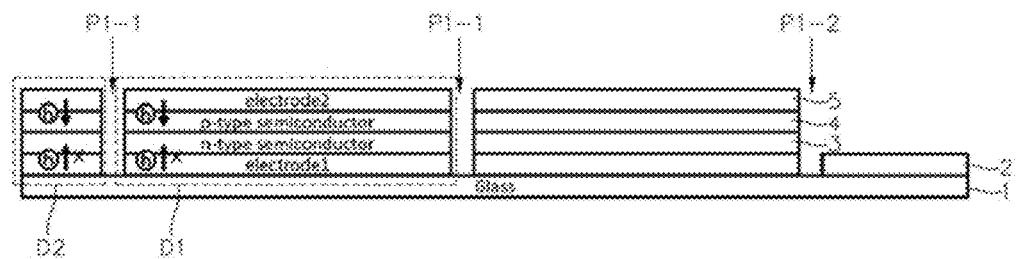
FIGS. 7 to 13 are diagrams of processes of manufacturing a colored tandem solar cell module according to an embodiment of the present invention.

Referring to FIG. 7, a first electrode 2, a first semiconductor layer 3 in an n-type (or p-type), a second semiconductor layer 4 in a p-type (or n-type), and a second electrode 5 are sequentially deposited on a glass substrate 1 and then are patterned through a scribing process P1 to form first and second inverse diodes D1 and D2.

The first inverse diode D1 is connected to bottom cells "Cell 1" to be formed later on the first inverse diode D1 and functions as a first bottom electrode of the bottom cell "Cell 1." The second inverse diode D2 is connected to top cells "Cell 2" to be formed later and functions as a second bottom electrode of the top cell "Cell 2."

The first electrode 2 and the first and second semiconductor layers 3 and 4 formed on the glass substrate 1 may all be made of a transparent material as in an oxide electrode, and the second electrode 5 may be made of an opaque material.

The scribing process P1 may be a process of separating and defining the first and second inverse diodes D1 and D2 and may be performed using a laser scribing method or a mechanical scribing method. In this case, the laser scribing method may be performed in a manner in which a laser is irradiated in a direction of the glass substrate 1 or in a direction (thin-film direction) opposite to the glass substrate 1.

At a processing portion "P1-1," the first electrode 2, the first semiconductor layer 3, the second semiconductor layer 4, and the second electrode 5 are all removed, and at a processing portion "P1-2," since the first and second semiconductor layers 3 and 4 and the second electrode 5 are not formed, only the first electrode 2 is removed. For example, a laser having an ultraviolet wavelength, which is absorbable by the first electrode 2, is irradiated onto portions, at which the processing portion "P1-1" and the processing portion "P2-2" are to be formed, to remove upper layers 3, 4, and 5 including the first electrode 2.

Figure 8:
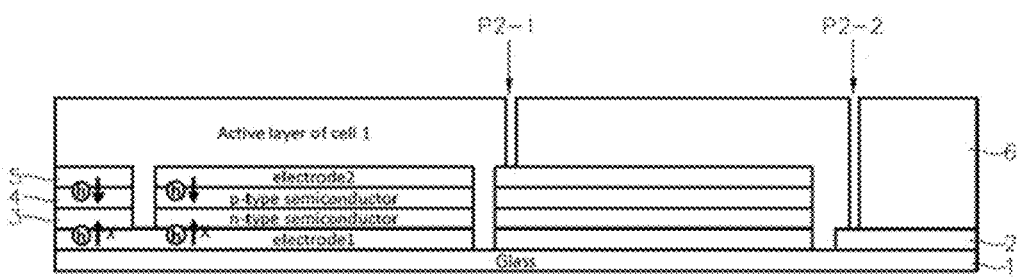

Subsequently, as shown in FIG. 8, after a first light absorption layer 6 of the bottom cell "Cell 1" is deposited on a structure of FIG. 7, a scribing process P2 is performed on the deposited first light absorption layer 6 at positions spaced apart from the processing portion "P1-1" and the processing portion "P1-2" to form a processing portion "P2-1" and a processing portion "P2-2."

The first light absorption layer 6 may be formed through a P-N junction composed of a photoactive layer and a buffer layer. The first light absorption layer 6 is formed on the second electrode 5 to extend to the processing portion "P1-1" formed between the first inverse diode D1 and the second inverse diode D2 and thus is connected to the first inverse diode D1. Accordingly, the first inverse diode D1 functions as the first bottom electrode of the bottom cell "Cell 1."

The processing portions "P2-1" and "P2-2" are processing portions formed in the first light absorption layer 6 of the bottom cell "Cell 1," and a scribing process of forming the processing portion "P2-1" may be performed using a pulsed laser scribing method performed in a manner in which a laser is incident in a direction opposite to the glass substrate 1 or may be performed using a mechanical scribing method.

A scribing process of forming the processing portion "P2-2" may be performed using a pulsed laser scribing method performed in a manner in which a laser is incident in a direction opposite to the glass substrate 1 or a direction of the glass substrate 1 or may be performed using a mechanical scribing method.

Figure 9:
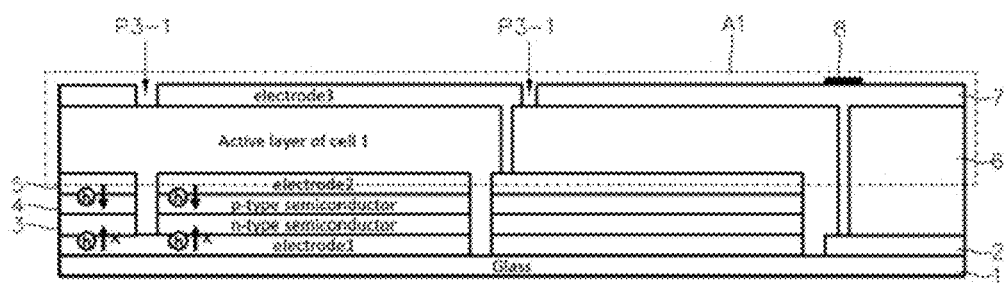

Subsequently, as shown in FIG. 9, after a third electrode 7 functioning as a first top electrode of the bottom cell "Cell 1" is deposited on a structure of FIG. 8, a scribing process P3 is performed on a portion of the third electrode 7 at which a processing portion "P3-1" is to be formed and which is at a position spaced apart from the processing portion "P2-1," thereby forming the processing portion.

The bottom cells "Cell 1," in which the second electrode 5, the first light absorption layer 6, and the third electrode 7 are sequentially stacked, are formed on the first and second inverse diodes D1 and D2 through the scribing process P3, and the bottom cells "Cell" are connected in series to form a bottom cell array A1.

The scribing process P3 may be performed in a manner in which, by using a laser having a wavelength, which passes though the third electrode 7 and is also absorbed by the light absorption layer 6 of the bottom cell "Cell 1," the third electrode 7 is removed with a thermo elastic impact applied by the laser absorbed by the first light absorption layer 6 of the bottom cell "Cell 1."

Alternatively, for another example, the scribing process P3 may be performed in a manner in which the third electrode 7 is selectively removed using a laser having an ultraviolet wavelength absorbed by the third electrode 7.

Meanwhile, after the processing portion "P3-1" is formed through the scribing process P3, a metal thin-film layer 8 for an alignment mark is deposited on the third electrode 7, preferably at a position at which photoelectrons are extracted from the tandem solar cell module, by using a shadow mask.

The metal thin-film layer 8 may be a sacrificial metal layer for connecting the bottom cell array A1 and the top cell array A2 in parallel, may be made of a material that is opaque to visible light, and may be made of aluminum (Al) or molybdenum (Mo) having high adhesion with the third electrode 7 corresponding to the first top electrode.

Figure 10:
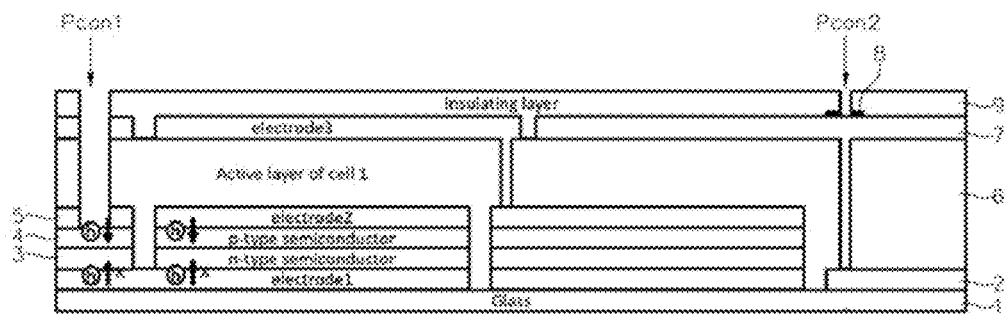

Subsequently, as shown in FIG. 10, after an insulating layer 9 is applied on a structure of FIG. 9 so as to electrically separate the bottom cell array A1 and the top cell array A2, a laser scribing process is performed to form a processing portion "Pcon1" as a connection portion for connecting the top cell array A2 to the second electrode 5 of the second inverse diode D2 and to form a processes portion "Pcon2"

for connecting the bottom cell array A1 and the top cell array A2 in parallel at a first terminal T1.

As the insulating layer 9 electrically separating the bottom cell array A1 and the top cell array A2 from each other, a solution-deposited or vapor-deposited polymer thin-film or oxide insulating layer thin-film may be used. For example, the insulating layer 9 may include an organic or inorganic thin-film layer that is transparent to visible light and near-infrared light and may be formed through an atomic layer deposition method or a vapor phase chemical deposition method.

The processing portion "Pcon1" is a connection portion for connecting the top cell array A2, i.e., a fourth electrode 10 corresponding to a second bottom electrode of a first top cell among the top cells "Cell 2", to the second inverse diode D2. The processing portion "Pcon1" is processed by irradiating a pulse laser having a wavelength, which passes through the first electrode 2 and the first and second semiconductor layers 3 and 4 and is absorbable by the second electrode 5, from a rear surface of the glass substrate 1. In this case, the second electrode 5, the first light absorption layer 6, the third electrode 7, and the insulating layer 9 are removed together.

The processing portion "Pcon2" is a connection portion for processing the insulating layer 9 and the metal thin-film layer 8 so as to electrically bond the bottom cell array A1 and the top cell array A2 at the first terminal T1 that is a terminal opposite to the first and second inverse diodes D1 and D2. A laser is irradiated onto the metal thin-film layer 8 to remove the insulating layer 9 and the metal thin-film layer 8 together. In this case, the processing portion "P2-2" may be formed by irradiating a laser in a direction opposite to the glass substrate 1 or irradiating a laser having a beam line width smaller than a processing line width of the processing portion "P2-2" in a direction of the glass substrate 1 along the inside of a processing line of the processing portion "P2-2."

Figure 11:
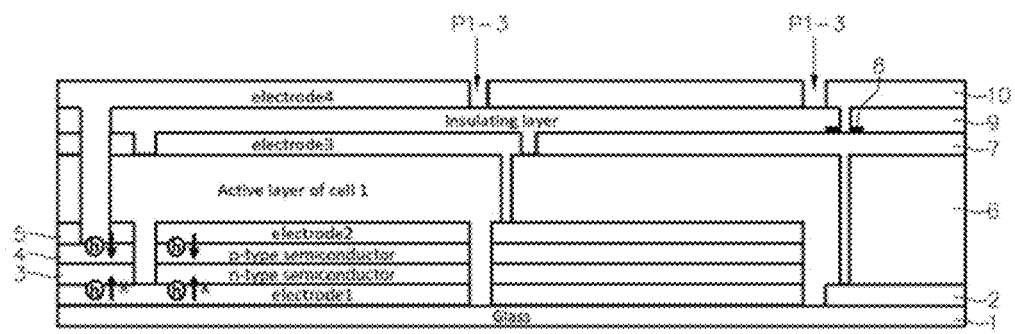

Then, as shown in FIG. 11, after the fourth electrode 10 corresponding to a bottom electrode of the top cell "Cell 2" is deposited on a structure of FIG. 10, a scribing process is performed along a processing line corresponding to (or aligned with) the processing portion "P1-1" or the processing portion "P1-2" to form each processing portion "P1-3."

The fourth electrode 10 is formed as a transparent electrode. In the scribing process of forming the processing portion "P1-3," by using a laser having an ultraviolet wavelength, which is absorbed by the fourth electrode 10 and does not degrade the insulating layer 9 applied thereunder, the processing portion "P1-3" is processed by allowing the laser to be incident in a direction opposite to the glass substrate 1.

Figure 12:
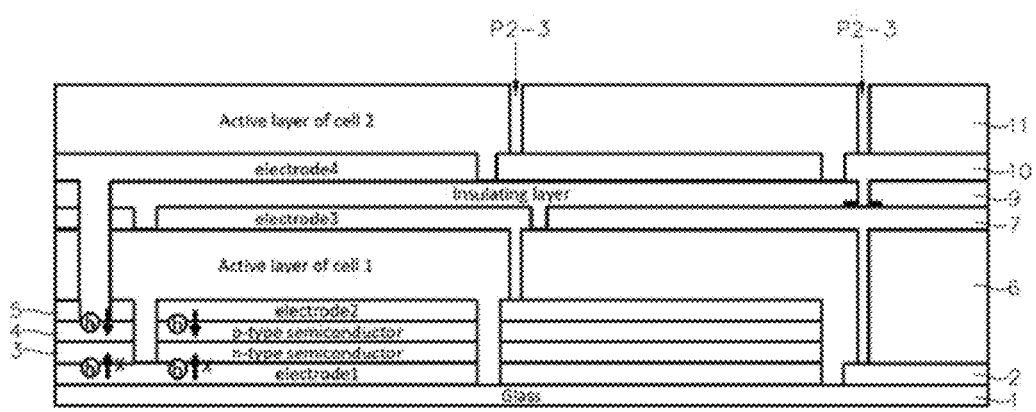

Subsequently, as shown in FIG. 12, after a second light absorption layer 11, which is an active layer of the top cell "Cell 2," is deposited on a structure of FIG. 11, a scribing process is performed to form processing portions "P2-3" at positions spaced apart from the processing portions "P1-3" to the right in the drawing. In this case, the scribing process is performed along processing lines corresponding to the processing portion "P2-1" and the processing portion "P2-2" formed in FIG. 8 to form the processing portions "P2-3" so as to be aligned with the processing portions "P2-1" and "P2-2."

As in the bottom cell "Cell 1," the second light absorption layer 11 may be formed as a P-N junction layer, and the scribing process of forming the processing portion "P2-3" is performed in a manner in which a pulse laser having a wavelength, which is absorbed by the second light absorption layer 11, is irradiated in a direction opposite to the glass substrate 1.

Figure 13:
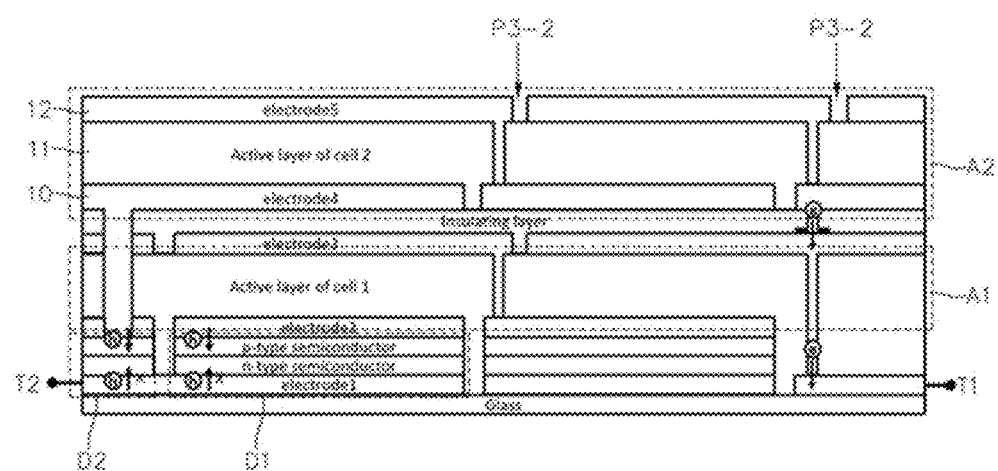

Next, as shown in FIG. 13, after a fifth electrode 12 functioning as a second top electrode of the top cell "Cell 2" is deposited on a structure of FIG. 12, a scribing process is performed at positions spaced apart from processing lines of the processing portion "P2-3" to form a plurality of processing portions "P3-2" spaced apart from each other.

Like the process of forming the processing portion "P3-1," the scribing process of forming the processing portion "P3-2" may use a laser having a wavelength capable of passing through the fifth electrode 12 and also capable of being absorbed by the second light absorption layer 10 of the top cell "Cell 2" to remove the fifth electrode 12 or may use a laser having an ultraviolet wavelength capable of directly processing the fifth electrode 12. In this case, a laser is incident in a thin-film direction to process all the processing portions "P3-2."

Meanwhile, the third electrode 7, the fourth electrode 10, and the fifth electrode 12 may be made of a material having a transmittance of 50% or more at visible and near-infrared wavelengths for a laser scribing process and light incidence on the bottom cell array A1.

In addition, a band gap of the top cell constituting the top cell array A12, on which light is first incident, is greater than a band gap of the bottom cell constituting the bottom cell array A1 on which light is incident second.

When a process as shown in FIG. 13 is completed, the formation of the bottom cell array A1 and the top cell array A2 respectively including two bottom cells "Cell 1" and two top cells "Cell 2" is completed.

When the bottom cell array A1 and the top cell array A2 each include a plurality of cells, a colored tandem solar cell module according to an embodiment of the present invention may be completed as shown in FIG. 5.

As shown in FIG. 5, the bottom cell array A1 including M bottom cells "Cell 1" and the top cell array A2 including N top cells "Cell 2" are formed. Here, N and M may be the same or different. However, in order to minimize a dead zone defined by a scribing line in a single integrated tandem solar cell module, it is preferable that N=M.

Meanwhile, as shown in FIGS. 7 to 13, in the colored tandem solar cell module according to the embodiment of the present invention, although an example of a structure has been described in which the first and second inverse diodes D1 and D2 are additionally inserted at a point at which holes are extracted, when the first and second inverse diodes D1 and D2 need to be additionally inserted at a point at which electrons are extracted, the inverse diode may have a structure in which a first electrode, a p-type semiconductor layer, an n-type semiconductor layer, and a second electrode are disposed from a direction of the glass substrate 1.

Figure 14:
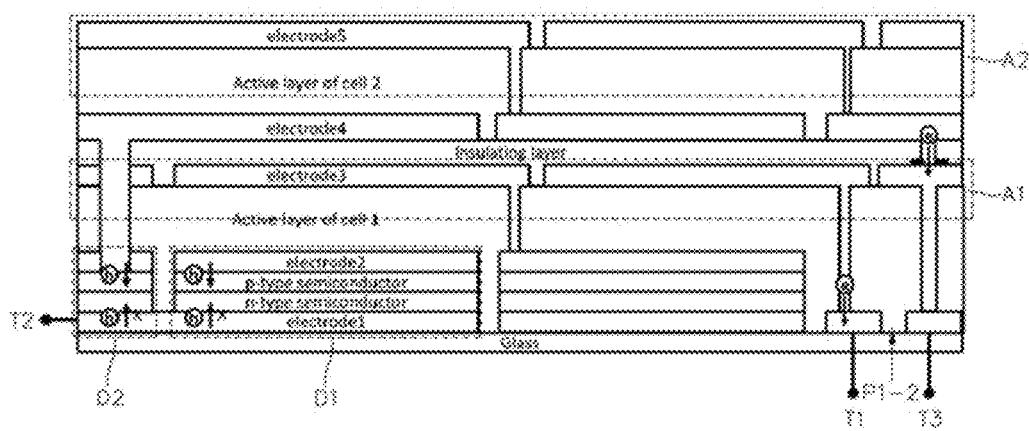
FIG. 14 is a diagram illustrating a colored tandem solar cell module according to another embodiment.
Figure 15:
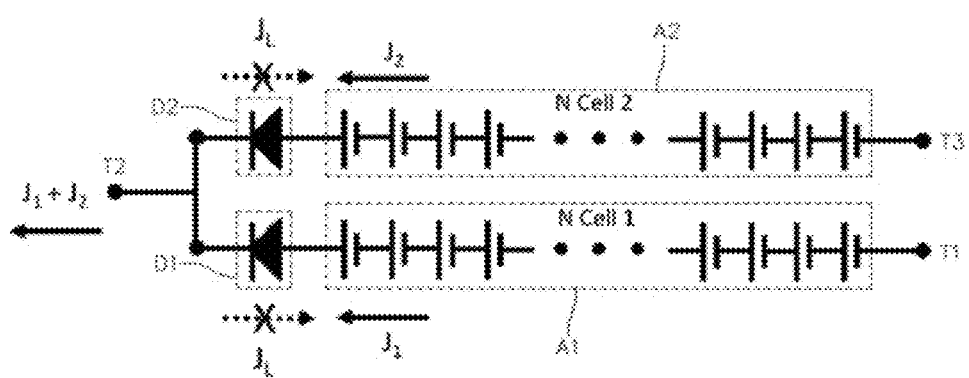
FIG. 15 is an equivalent circuit diagram of the colored tandem solar cell module sown in FIG. 14.

FIG. 14 is a diagram illustrating a colored tandem solar cell module having a three-terminal type according to another embodiment, and FIG. 15 is an equivalent circuit diagram of the colored tandem solar cell module having a three-terminal type shown in FIG. 14.

Referring to FIGS. 14 and 15, the colored tandem solar cell module according to another embodiment of the present invention is formed as a three-terminal tandem solar cell module having a structure with three terminals T1 to T3.

In the three-terminal tandem solar cell module according to another embodiment of the present invention, a bottom cell array A1 and a top cell array A2 may each independently generate photovoltaic power. For example, if necessary, only the top cell array A2 or the bottom cell array A1 may generate photovoltaic power, or the top cell array A2 and the bottom cell array A1 may generate photovoltaic power at the same time. In the latter case, first and second inverse diodes D1 and D2 may be inserted to eliminate the need for photovoltage matching caused in a simultaneous photovoltaic power generation process. A reverse current is blocked by the first and second inverse diodes D1 and D2.

As shown in FIG. 14, in the three-terminal tandem solar cell module in which the first and second inverse diodes D1 and D2 are inserted, for the three terminals T1 to T3, a first electrode 2 is additionally formed by being separated through a processing portion "P1-2" at a position at which photoelectrons are extracted. As described with reference to FIGS. 7 to 13, the stacking order of the first and second semiconductor layers of the first and second inverse diodes D1 and D2 may be changed according to the direction of a photocurrent, and in the direction of the photocurrent, the processing portion "P1-2," that is, a processing point, may be formed at a position at which photoelectrons are extracted and may also be formed at a position at which photoholes are extracted.

Figure 16A:
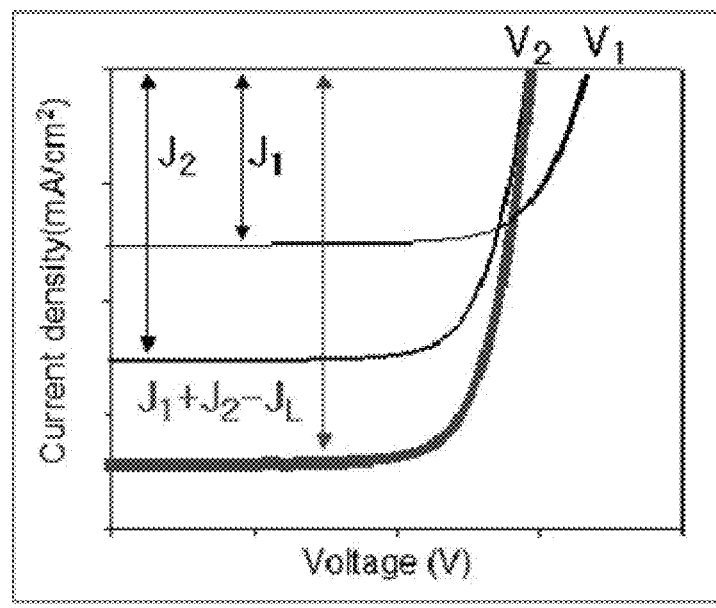
FIG. 16A and FIG. 16B show graphs showing a comparison between power generation efficiencies of colored tandem solar cell modules according to embodiments of the present invention, with FIG. 16A showing power generation efficiency of a solar cell module before inverse diodes are inserted, and FIG. 16B showing power generation efficiency of a solar cell module after inverse diodes are inserted.
Figure 16B:
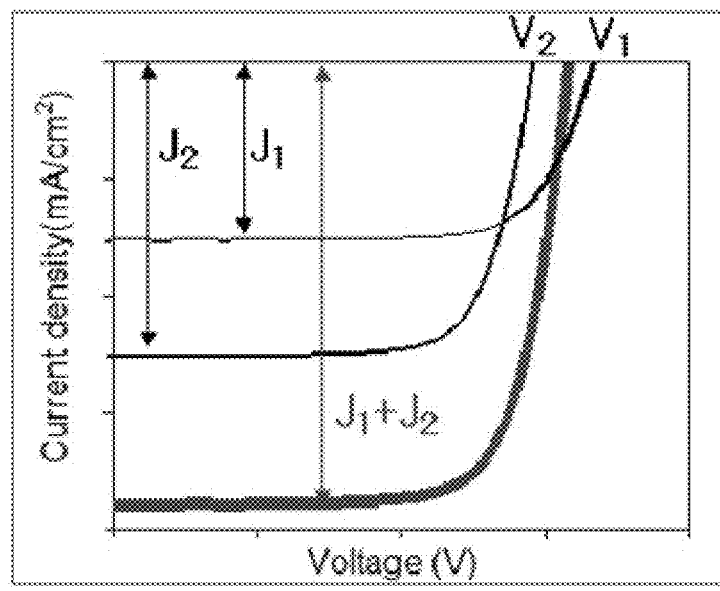

FIG. 16 shows efficiency comparison graphs showing a comparison between power generation efficiencies of colored tandem solar cell modules according to embodiments of the present invention, FIG. 16A shows power generation efficiency of a solar cell module before inverse diodes are inserted (related art), and FIG. 16B shows power generation efficiency of a solar cell module after inverse diodes are inserted.

As shown in FIG. 16B, when the tandem solar cell module is implemented by additionally inserting the inverse diodes, it can be seen that power loss is minimized to improve power generation efficiency as compared with a structure in which the inverse diodes are not inserted. Therefore, a strategy for modularizing a tandem solar cell using a low-cost and high-efficiency light-absorption layer material is possible, thereby reducing power generation costs of a solar cell module.

Meanwhile, in the structures of the tandem solar cell modules shown in FIGS. 5, 7 to 13, and 14, although the cross-sections thereof are briefly illustrated for convenience of description, a separate layer for connecting or separating the bottom cell "Cell 1," the top cell "Cell 2," and the first and second inverse diodes D1 and D2 may be additionally formed so as to correspond to the equivalent circuit diagrams shown in FIGS. 4 and 15.

Figure 17:
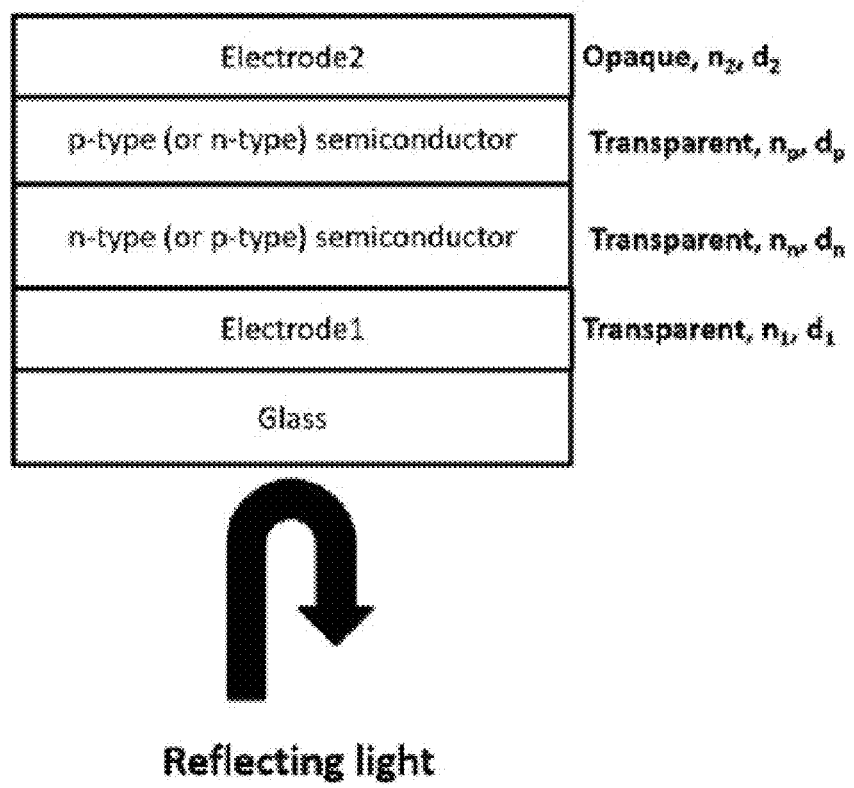
FIG. 17 is a diagram for describing a principle of adjusting a color of a colored tandem solar cell module according to an embodiment of the present invention.

FIG. 17 is a schematic diagram for describing a principle of adjusting a color of a colored tandem solar cell module according to an embodiment of the present invention. As shown in FIG. 17, as one of the technical features of the present invention, a color is adjusted using thin-films of first and second inverse diodes D1 and D2.

As described above, in the first and second inverse diodes D1 and D2, which are additionally inserted into the colored tandem solar cell module according to the present invention, the first electrode and the first and second semiconductor layers (inverse diode thin-films) are all made of a material transparent to visible light, and the second electrode is made of an opaque metal material.

For example, a refractive index of an n-type (or p-type) semiconductor thin-film is defined by $n_n$ (or $n_p$), and a thickness thereof is defined by $d_n$ (or $d_p$). In this case, the intensity and spectrum of light reflected from a substrate due to the refractive index and thickness of the first and second semiconductor layers, that is, semiconductor thin-film layers, are determined by Equations below.

$$R = \left[\frac{n_1(n_n)^2 - n_2(n_p)^2}{n_1(n_n)^2 + n_2(n_p)^2}\right]^2 \quad \text{[Equation 1]}$$

$$d_p = \frac{\lambda_0}{4n_p} \text{ and } d_n = \frac{\lambda_0}{4n_n} \quad \text{[Equation 2]}$$

$$\Delta\lambda = \frac{4\lambda_0}{\pi}\arcsin\left[\frac{n_n - n_p}{n_n + n_p}\right] \quad \text{[Equation 3]}$$

In [Equation 1], "R" refers to reflectance from a glass substrate, and in [Equation 2] and [Equation 3], "$\lambda_0$" refers to a reflected center wavelength, and "$\Delta\lambda$" refers to a spectrum width of a reflected wavelength.

The present invention uses a reflection principle based on a distributed bragg reflection (DBR) method, and as shown in the Equations above, it can be seen that it is possible to determine a center wavelength, reflection intensity, and a reflected spectrum width of a reflective color which are represented by a refractive index difference between materials of semiconductor thin-film layers used in a P-N junction diode constituting an inverse diode, and a thickness of the thin-film layer of the inverse diode.

That is, in the colored tandem solar cell module according to the present invention, the refractive index and thickness of the first and second semiconductor layers constituting the first and second inverse diodes D1 and D2 are adjusted within a condition range satisfying the Equations above, thereby adjusting a color of a reflective color formed on the rear surface of the glass substrate 1.

Therefore, the tandem solar cell module according to the embodiments of the present invention can perform electrical and optical roles by additionally inserting an inverse diode into an end of each cell array, thereby eliminating the need for photocurrent matching and being implemented without a separate color filter.

The description of the present invention is intended for illustration, and those skilled in the art will appreciate that the present invention can be easily modified in other detailed forms without changing the technical spirit or essential features of the present invention. Therefore, the above-described embodiments should be understood as being exemplary rather than restrictive. The scope of the present invention should be defined by the accompanying claims, and all changes or modifications derived from the meanings and scopes of the claims and equivalents thereof should be construed as being included in the scope of the present invention.

What is claimed is:

1. A tandem solar cell module comprising:
   a substrate;
   a first inverse diode and a second inverse diode which are formed to be separated from each other on the substrate and each have a structure in which a first electrode, a first semiconductor layer, a second semiconductor layer, and a second electrode are sequentially stacked;
   a bottom cell array having a series cell array structure in which solar cells, which each include a first bottom electrode formed of the first inverse diode, a first light absorption layer formed on the first bottom electrode, and a first top electrode formed on the first light absorption layer, are connected in series;
   an insulating layer formed on the bottom cell array; and
   a top cell array connected in parallel with the bottom cell array and having a series cell array structure in which solar cells, which each include a second bottom electrode formed on the insulating layer and having at least one side portion connected to the second inverse diode, a second light absorption layer formed on the second bottom electrode, and a second top electrode formed on the second light absorption layer, are connected in series.

2. The tandem solar cell module of claim 1, wherein the first electrode and the first and second semiconductor layers are made of a material transparent to visible light, and
the second electrode is made of an opaque material.

3. The tandem solar cell module of claim 1, wherein the first and second semiconductor layers are semiconductor thin-film layers having opposite polarities and are formed as one of an n-type semiconductor thin-film layer and a p-type semiconductor thin-film layer.

4. The tandem solar cell module of claim 1, wherein a band gap of the solar cell constituting the top cell array is greater than a band gap of the solar cell constituting the bottom cell array.

5. The tandem solar cell module of claim 1, wherein number of the solar cells constituting the bottom cell array is the same as or different number of the solar cells constituting the top cell array.

6. The tandem solar cell module of claim 1, wherein the first top electrode, the second bottom electrode, and the second top electrode are made of a material having a transmittance of 50% or more at visible and near-infrared wavelengths.

7. The tandem solar cell module of claim 1, wherein a metal thin-film layer is formed on the insulating layer to connect the bottom cell array and the top cell array in parallel.

8. The tandem solar cell module of claim 7, wherein the metal thin-film layer is made of a material opaque to visible light and is made of aluminum (Al) or molybdenum (Mo) having high adhesion with the first top electrode.

9. The tandem solar cell module of claim 7, wherein the insulating layer is formed as an organic or inorganic thin-film layer that is transparent to visible light and near-infrared light and is formed through an atomic layer deposition method or a chemical vapor deposition method.

10. The tandem solar cell module of claim 1, wherein a processing portion ("P1-1") and a processing portion ("P1-2"), which separate the first inverse diode from the second inverse diode, are formed through a laser scribing method or a mechanical scribing method, and
in the forming using the laser scribing method, a pulse laser having an ultraviolet wavelength absorbed by the first electrode is used.

11. The tandem solar cell module of claim 1, wherein a processing portion ("P2-1") and a processing portion ("P2-2"), which separate the first light absorption layer of the solar cell constituting the bottom cell array, are formed using a laser scribing method or a mechanical scribing method, and
in the forming using the laser scribing method, a laser is incident in a direction of the substrate or a direction opposite to the substrate to process and form the processing portion ("P2-1") and the processing portion ("P2-2").

12. The tandem solar cell module of claim 1, wherein a processing portion ("Pcon1") formed to connect the second bottom electrode to the second inverse diode is formed using a laser scribing method, and
in the laser scribing method, by using a laser having a wavelength, which passes through the first electrode and the first and second semiconductor layers and is absorbed by the second electrode, the first light absorption layer, the first top electrode, and the insulating layer stacked on the second electrode are removed together with a thermal elastic force caused by the laser absorbed by the second electrode.

13. The tandem solar cell module of claim 7, wherein a processing portion ("Pcon2") formed in the insulating layer and the metal thin-film layer to connect one side of the bottom cell array and the top cell array is formed by irradiating a laser in a direction of the substrate or a direction opposite to the substrate using a laser scribing method, and
in the laser scribing method, the insulating layer is removed using a laser having a wavelength absorbed by the metal thin-film layer.

* * * * *